United States Patent [19]

Goldberg

[11] 4,083,020
[45] Apr. 4, 1978

[54] VOLTAGE CONTROLLED OSCILLATOR

[75] Inventor: Mitchell J. Goldberg, Lansdale, Pa.

[73] Assignee: Solid State Scientific Inc., Montgomeryville, Pa.

[21] Appl. No.: 778,796

[22] Filed: Mar. 17, 1977

[51] Int. Cl.² .......................................... H03K 3/282
[52] U.S. Cl. ............................. 331/113 R; 331/108 C
[58] Field of Search ............... 331/108 C, 108 D, 111, 331/113 R

[56] References Cited

U.S. PATENT DOCUMENTS 3,702,446  11/1972  Steudel ........................... 331/108 D

*Primary Examiner*—John Kominski
*Attorney, Agent, or Firm*—Frailey & Ratner

[57] ABSTRACT

A voltage controlled oscillator whose frequency is a function of an input voltage having a first and a second pair of switching devices coupled respectively to first and second terminals of a capacitor. The oscillator has a first leg coupled from the first capacitor terminal through first inverter means, a first NOR device and third inverter means back to the first pair of switching devices and the first capacitor terminal. The second leg is coupled from the second capacitor terminal through second inverter means, a second NOR device, fourth inverter means back to the second pair of switching devices and the second capacitor terminal. The first and second NOR devices are directly cross-connected. The first and second legs each have the same number of propagation delays and during state transition, both terminals of the capacitor are coupled to the reference potential for a brief instant of time.

13 Claims, 2 Drawing Figures

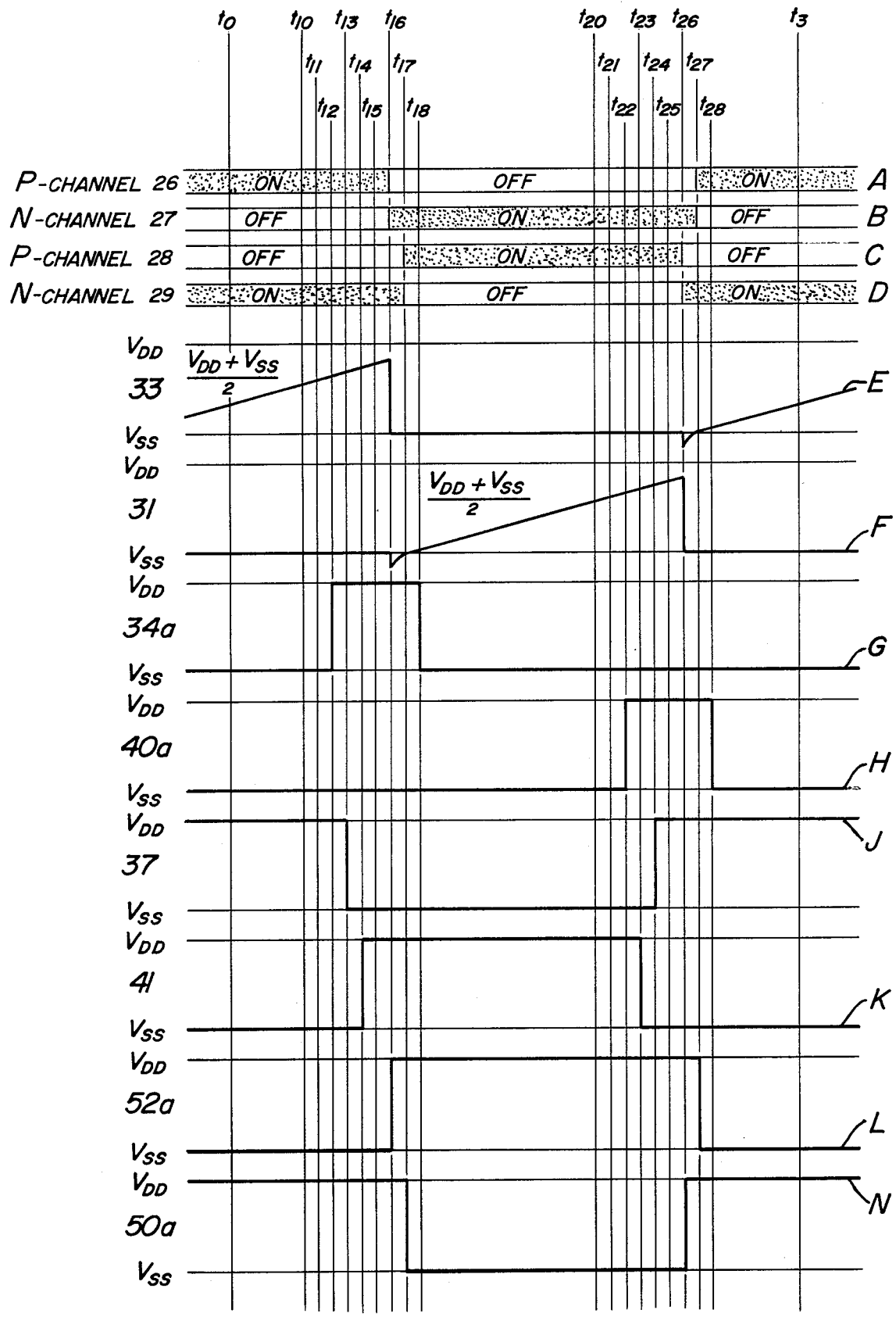

VOLTAGE CONTROLLED OSCILLATOR

BACKGROUND OF THE INVENTION

A. Field of the Invention

This invention relates to the field of art of voltage controlled oscillators.

B. Prior Art

Variable oscillators have been known in which the frequency of the oscillator may be readily varied to meet the requirements of an application. Such applications have included frequency modulation for telemetry and data communications, triggered generators for variable frequency power inverters and phase-locked loop systems. Such applications have generally required a large ratio between maximum and minimum available frequency and thus variable oscillators have not used resonant circuit elements but have instead operated on the relaxation principle. A capacitor has been charged to a predetermined level at which its discharge is initiated and a new charging cycle begun. In such variable oscillators, the frequency has been varied over considerable range by varying the charging rate or the discharge threshold level or both. However, some prior variable oscillators have left much to be desired in their requirement of auxiliary circuits in order to start the oscillator. A further deficiency has been that during the time of transition of the state of the oscillator the charging current source has been simultaneously connected to both sides of the capacitor causing objectionable supply current spikes as well as asymmetry of the two portions of the oscillator cycle.

SUMMARY OF THE INVENTION

A voltage controlled oscillator whose frequency is a function of an applied input voltage and having means for supplying current of value which is a function of that input voltage. A first and a second pair of switching devices are coupled respectively to first and second terminals of a storage device. One terminal of a first switching device of each pair is connected to the current supply and one terminal of a second switching device of each pair is connected to a reference potential. First and second inverter means are coupled respectively between the first and second storage device terminal and a respective input of first and second cross-connected NOR devices. Third and fourth inverter means are coupled respectively between an output of the first and second NOR devices and an input of the first and second pair of devices respectively. In this manner, the switching devices are controlled to couple one of the capacitor terminals to the current supply means and the other capacitor terminal to the reference potential. Upon state transition one capacitor terminal is first coupled to the reference potential before the other capacitor terminal is switched to the current supply means. In this manner, both sides of the capacitor are connected to the reference potential for a substantially brief instant of time until the switching state transition is completed.

BRIEF DESCRIPTION OF THE DRAWINGS

FIG. 2 illustrates waveforms at various points in the oscillator of FIG. 1 helpful in understanding the operation thereof.

DETAILED DESCRIPTION

Figure 1:
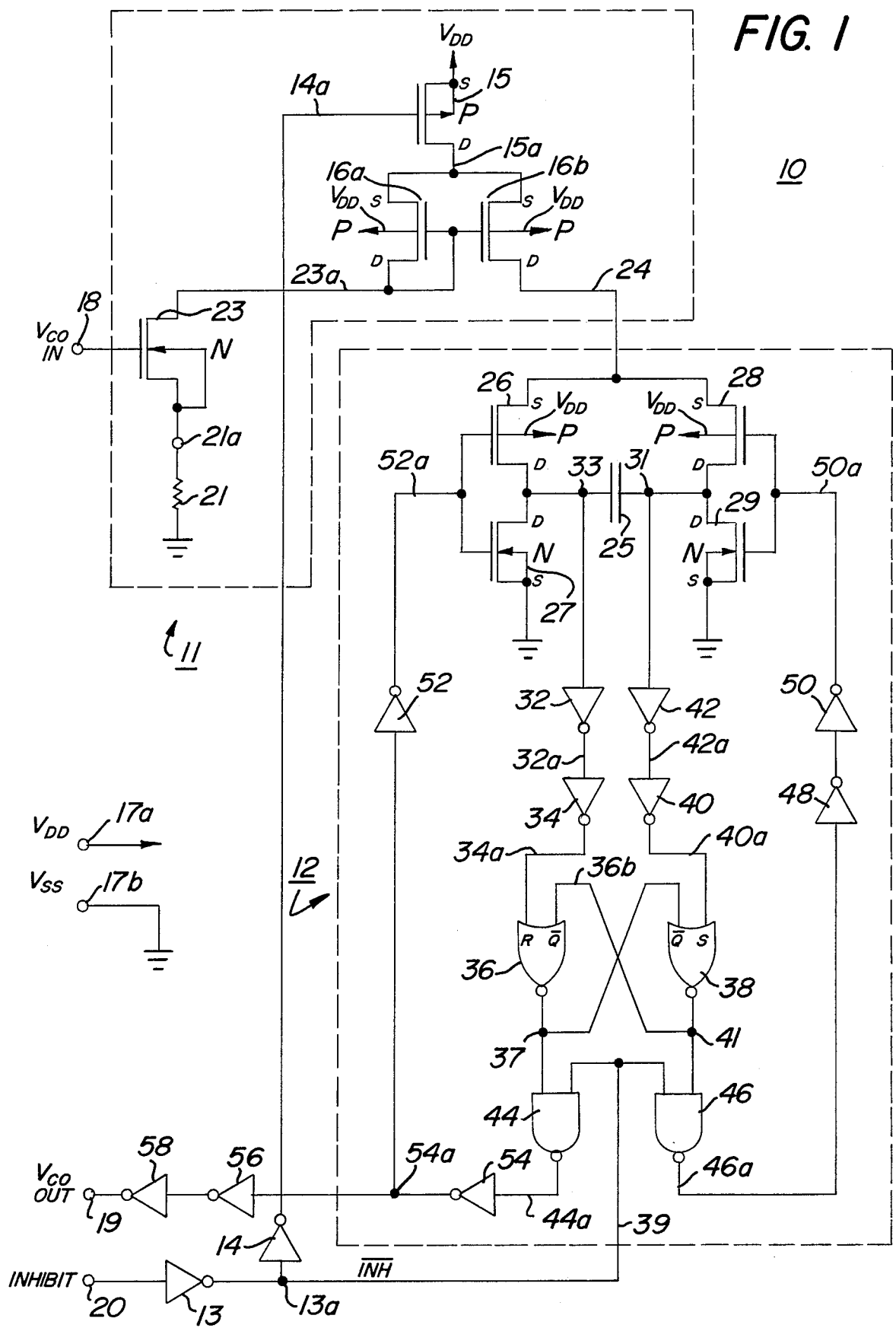
FIG. 1 illustrates in block diagram form a voltage controlled oscillator embodying the invention.

Referring now to FIG. 1, there is shown a CMOS voltage controlled oscillator of the relaxation type. Voltage controlled oscillator (VCO) 10 comprises generally two systems, current supply system 11 and current switching system 12. Inverter elements which do not contribute to the fundamental operation of the systems 11 or 12 are shown separate from these systems.

Current supply 11 provides a current on line 24 which is constant over the entire range of voltages imposed on line 24 by current switching system 12. The magnitude of the current on line 24 is a function of the VCO input voltage at terminal 18 and upon the values of resistor 21. For ease of explanation, it will be assumed throughout that these latter parameters remain essentially constant during one cycle of oscillator output. That is to say that the maximum frequency of changes imposed upon the current output is usually much smaller that the minimum frequency of oscillation produced by the switching system.

Current switching system 12 clamps one terminal of a capacitor 25 to circuit ground and admits current from line 24 to the other terminal. When the voltage of the capacitor reaches a threshold value, a switching transfer is initiated wherein the capacitor is discharged, and current is then admitted to its other terminal while the first terminal is grounded. When the capacitor voltage has once again reached a threshold value, transfer of switching to the original condition is initiated thus completing one whole cycle of oscillation. These oscillations are manifested by voltage transitions appearing at junction 54a which are then fed to a VCO output terminal 19 by way of inverters 56 and 58 which act as buffers.

An inhibit circuit allows the user to turn off the oscillator at will, regardless of the voltage at the VCO input terminal. Specifically, an inhibit input voltage applied to inhibit terminal 20 is inverted by inverter 13 for use in switching system 12 and reinverted by inverter 14 for use in current supply system 11.

In current supply system 11, current flows from the $V_{DD}$ terminal 17a to junction 15a when transistor 15 is enabled by a low voltage on line 14a. Line 14a is low whenever the inhibit input at terminal 20 is made low. For the purpose of this description it will be assumed that the inhibit function is always low. Accordingly, current at junction 15a then flows through transistors 16a and 16b which are connected as a current-mirror pair. In this configuration, transistor 16a and whatever current subsequently flows from junction 23a to $V_{SS}$ (ground) terminal 17b is matched by an equal current flow out of junction 24. This equality is maintained for any voltage present on junction 24 between $V_{SS}$ and $V_{DD}$.

Transistor 23 is a source follower and thus the current through resistor 21 is a function of its value and of the voltage present at terminal 18. The total current flow through line 23a thus increases linearly with the VCO input voltage as the latter is varied. The current at line 24 which must match the current on line 23a is thus controlled by the input voltage at terminal 18 and the values of resistor 21.

In current switching system 12, a capacitor 25 is connected by way of terminals 31 and 33 to a switching bridge comprising P-channel CMOS transistors 26 and 28 and N-channel CMOS transistors 27 and 29. In general, the P-channel transistor of one leg of the bridge will be conducting while the N-channel transistor of the other leg of the bridge is conducting. Thus, one terminal of the capacitor is held to ground ($V_{SS}$) potential while the other terminal is subjected to the constant current available from junction 24. When the capacitor voltage reaches a predetermined value, it initiates a chain of events which results in the reversal of the conducting states of the switching bridge causing the capacitor terminal that was formerly receiving charging current to be grounded and the one that was grounded to start receiving charging current. This condition persists until the capacitor voltage once again reaches a certain value at which point a reversal of the conducting states of the bridge is once again initiated. This alternation of conducting states continues in sequence to produce the desired oscillations.

Examining this circuit now in more detail, it is to be pointed out that the outputs of NOR gates 36 and 38 can never be high at the same time. If it were assumed that both were high then the high at junction 37 wound immediately force junction 41 to be low. Alternatively, the high at junction 41 would immediately cause junction 37 to be low. Accordingly, only one junction can be high with the other low or both can be low at the same time.

When starting oscillator 10, if it were assumed that both junctions 37 and 41 were low, then the outputs of NAND gates 44 and 46, (continuously enabled by the low on inhibit terminal 20) will both be high. The high at line 44a is transmitted to line 52a by inverters 54 and 52 thereby causing line 52a to be high. Similarly, the high on line 46a is transmitted to line 50a by inverters 48 and 50 causing it to be high. As a result, N-channel transistors 27 and 29 are turned ON and P-channel transistors 26 and 28 are both turned OFF. This causes both terminals 31 and 33 to be at ground which in turn causes line 34a and 40a to both be low. Because junctions 37 and 41 are already both low, they both would tend to go high but only one may go high in order to avoid the previously explained impossible state of both being high. If, for example, junction 37 goes high, it creates a low at line 52a which turns N-channel transistor 27 OFF and P-channel transistor 26 ON. Line 46a remains high causing N-channel transistor 29 to be ON and P-channel transistor 28 to be OFF. Thus, terminal 31 is held at ground and terminal 33 is connected to junction 24. Capacitor 25 receives the constant current from junction 24 and as a result its voltage increases linearly. It can thus be seen that oscillator 10 having "symmetrical" gating never fails to start.

The foregoing operation is illustrated in FIG. 2. It may be assumed that the conditions described up to now exist at time $t_0$. The conduction states of transistors 26–29 are represented by the striped bands A, B, C and D. At time $t_0$, transistor is ON, 27 is OFF, 28 is OFF and 29 is ON. The voltage at junction 31 as shown by waveform F is at $V_{SS}$ (ground) potential while the voltage at junction 33 as shown by waveform E is rising linearly. Both of these voltages are below the input switching threshold voltage of inverters 32 and 42. Therefore, the outputs 32a and 42a are both high and the outputs of inverters 34 and 40 at 34a and 40a respectively are both low as shown by waveforms G and H. Accordingly, the voltage of junction 37 (waveform J) is high as previously explained and that of junction 41 (waveform K) is low. As a result, the voltage at junction 52a (waveform M) is low and the voltage of junction 50a (waveform N) is high. These latter voltages maintain the switching transistors in the states shown by waveforms A, B, C and D.

At time $t_{10}$ the voltage at junction 33 reaches the input switching threshold voltage of inverter 32 which is a voltage nominally midway between $V_{SS}$ and $V_{DD}$. This causes the inverter output at output 32a to go low but because of the propagation delay, this does not occur until time $t_{11}$. Consequently, line 34a goes high but again because of the propagation delay through inverter 34, this does not occur until a later time $t_{12}$ as shown on waveform G. This causes the output of NOR gate 36 to go low but because of the propagation delay through the gate, junction 37 does not go low until a later time $t_{13}$. Due to the propagation delay through NAND gate 44, the voltage at junction 44a goes high at time $t_{14}$. The voltage at junction 54a consequently goes low at time $t_{15}$ and the voltage at junction 52a goes high at time $t_{16}$. In other words, the time delay from the transition at junction 37 at time $t_{13}$ to the transition of junction 52a at time $t_{16}$ is caused by the propagation delays through the three gates 44, 54 and 52.

When the voltage at 52a becomes high, the conducting states of transistors 26 and 27 are reversed. This effectively breaks the connection between capacitor terminal 33 and the constant current supply junction 24 and instead connects 33 to ground. Since transistor 29 is still ON, both capacitor terminals are now at ground (time $t_{16}$) causing a discharge of capacitor 25. Capacitor terminal 33 having been at some positive voltage is pulled to ground potential by transistor 27 turning ON. Since the capacitor cannot discharge instantaneously, the other terminal 31 is forced negative which forward biases the drain of transistor 29 with respect to its substrate. This allows the capacitor discharge current to flow with terminal 31 one diode drop negative with respect to ground as shown on waveform F. The complete discharge of capacitor 25 then proceeds very quickly.

While the foregoing occurs, the transition to low which occurred at junction 37 is propagating around to junction 50a in the following manner. With output 40a alreadly low, junction 41 becomes high at time $t_{14}$ due to the propagation delay through NOR gate 38. Because of the additional propagation delays through gate 46 and inverters 48 and 50, the consequent transition to low at junction 50a does not appear until time $t_{17}$ as compared with the transition at junction 52a occurring at $t_{16}$. This now turns transistor 28 ON and transistor 29 OFF as shown by waveforms C and D, FIG. 2. This established a connection between capacitor terminal 31 and current source junction 24 and charging of the capacitor begins again, this time with terminal 33 remaining at ground potential and terminal 31 increasing linearly.

It will now be understood that during the state transition both sides of capacitor 25 are connected to ground for a substantially brief instant of time. Specifically, at time $t_{16}$, junction 33 is switched to ground and junction 31 was previously at ground. This condition continues until time $t_{17}$. This switching state transition brief grounding of both sides of capacitor 25 is much preferable to coupling both sides to the current source which would cause supply current spikes.

The return of junction 33 voltage at time $t_{16}$ to ground potential causes line 34a to return to ground at time $t_{18}$ because of the propagation delays through inverters 32 and 34. All junction voltages are now stable with that of junction 31 increasing linearly at the same rate that junction 33 exhibited as previously described interval since the same capacitor is being charged and the magnitude of the current from junction 24 is not changed as a result of the switching action just described.

At time $t_{20}$, the voltage at junction 31 reaches the input switching threshold value (nominally $\frac{1}{2}$ ($V_{DD}$ + $V_{SS}$)) and a chain of events occurs similar to that described with respect to junction 33. After propagation delays through inverters 42 and 40, the voltage at junction 40a goes high at time $t_{22}$. This consequently causes the junction 41 to go low at time $t_{23}$. After propagation of this transition through gates 46 and inverters 48 and 50, the voltage of junction 50a goes high at time $t_{26}$. As shown by bands C and D, transistor 28 is turned OFF and transistor 29 is turned ON at this time. Thus, capacitor 25 again has both sides coupled to ground (until time $t_{27}$) and the capacitor discharges forcing the voltage at junction 33 negative by one diode drop.

The transition to low at junction 41 at time $t_{23}$ causes a high to appear at junction 37 at time $t_{24}$. Because of the propagation delays through gates 44 and inverters 54 and 52, the subsequent transition to low at junction 52a appears at time $t_{27}$. This turns transistor 26 ON and 27 OFF and charging of the capacitor proceeds once again, but with terminal 31 clamped to ground and terminal 33 rising. Finally, the voltage at line 40a goes low at time $t_{28}$ as a consequence of the return to low of junction 31 at time $t_{26}$. All voltages are stable once again with that of junction 33 linearly rising. At time $t_3$ the conditions which were prevalent at time $t_0$ are once again duplicated and the oscillator proceeds in the same way through every subsequent cycle until the power is turned off or until inhibit terminal 20 is made high.

A decrease in the value of resistor 21 or an increase in the voltage applied to VCO input terminal 18 or any combination of these two conditions will cause an increase in magnitude of the current delivered from current supply 11 by way of line 24 to current switching system 12. This causes the capacitor voltage to rise at a proportionately greater rate and thus decrease the time required to reach the input switching threshold voltage, thereby increasing the frequency of the oscillator. Decreasing the value of capacitor 25 also causes an increase in this rate.

It will be understood that the propagation delays previously referred may be in the order of tens of nanoseconds while the ramp time, i.e., the time from $t_{17}$ to $t_{20}$ may be generally measured in microseconds and even milliseconds — much greater than the gate propagation delay times — so that the time scale portrayed at FIG. 2 is exaggerated for the purpose of explanation. However, it would be possible to operate oscillator 10 at a very high frequency in which propagation delay times become an appreciable portion of the total oscillator period.

One advantage of the oscillator 10 is the guaranteed ability of the oscillations to start without resort to auxiliary gates that might favor one side of a symmetrical circuit and possible introduce asymmetry in operation. Another advantage is that the logic provides that switching transistors 26–29 can never maintain a connection between the current supply and both capacitor terminals simultaneously. If this were to happen, large positive voltage spikes would appear at the terminal of capacitor 25 which had been clamped at ground as the other terminal was linearly increasing. This in turn would leave the capacitor with initial voltages generally different during the two halves of the oscillator cycle resulting in significant asymmetry of the two portions of the oscillator cycle. Furthermore, large peaks of supply current would be drawn during the transition times.

In a typical example of oscillator 10, true 50% duty cycle has been provided with supply voltages set to any point between 3 and 15 volts and with the resistance of resistor 21 made as low as 250 ohms.

In summary, the symmetry and freedom from current spiking of oscillator 10 is achieved because the configuration of the logic gates associated with switching transistors 26–29 guarantees that one capacitor junction is disconnected from the charging supply before the other is connected. This occurs because the high-to-low transition, as for example at junction 37, which propagates to transistors 26, 27, travels through a similar path to transistors 28, 29 but only after an additional trip or propagation delay through the other NOR gate 38. Similarly, the high-to-low transition at junction 41 which propagates to transistors 28, 29 also travels to transistors 26, 27 but only after an additional trip through NOR gate 36.

The foregoing may be defined in the following manner. Capacitor terminal 33 is coupled through a first leg. The first leg comprises inverters 32 and 34, NOR gate 36, gate 44, and inverters 54 and 52 and then to a first pair of switching transistors 26 and 27 which are coupled to terminal 33. In this manner, the first leg returns back to its own first pair of switching transistors. Similarly, a second leg may be defined from capacitor terminal 31 through inverters 42 and 40, gates 38 and 46 and then through inverters 48 and 50 to a second pair of switching transistors 28, 29 which are coupled to terminal 31. In this manner, the second leg returns back to its own switching transistors. It will be understood that the first and second legs each have the same number of propagation delays where devices 32 and 34 provide an even number of inversions and devices 44, 54 and 52 provide an odd number of inversions. Similarly, devices 42 and 40 provide an even number of inversions while devices 46, 48 and 50 provide an odd number of inversions. Accordingly, the pairs of switching devices are controlled to couple one of the capacitor terminals to current supply line 24 and the other capacitor terminal to ground and upon state transition to first couple that one capacitor terminal to ground before switching the other capacitor terminal to line 24.

What is claimed is:

1. A voltage controlled oscillator whose frequency is a function of an input voltage comprising
   means for supplying current of value which is a function of said input voltage,
   a storage device having a first and a second terminal,
   a first and a second pair of switching devices coupled respectively to said first and second terminals of said storage device, each pair having a first and a second switching device, one terminal of each of said first switching devices being connected to said current supplying means and one terminal of each second switching device being connected to a reference potential,
   first and second cross-connected gating devices,
   first and second inverter means coupled respectively between said first and second storage device terminal and an input of said first and second gating devices,
   third and fourth inverter means coupled between an output of said first and second gating devices respectively and an input of said first and second pair of switching devices for controlling said switching devices to couple one of said storage device terminals to said current supplying means and the other storage device terminal to said reference potential and upon state transition to first couple said one storage device terminal to said reference potential before switching said other storage device terminal to said current supplying means.

2. The voltage controlled oscillator of claim 1 in which said first and second gating devices are first and second NOR devices and an additional input of said first NOR device is directly connected to said output of said second NOR device and an additional input of said second NOR device is directly connected to said output of said first NOR device whereby said outputs can never be high at the same time.

3. The voltage controlled oscillator of claim 2 in which a first path comprising said first inverter means, said first NOR device and said third inverter means has the same number of propagation delays as a second leg comprising said second inverter means, said second NOR device and said fourth inverter means.

4. The voltage controlled oscillator of claim 3 in which each of said first and second inverter means comprises a first and a second inverter coupled in series circuit.

5. The voltage controlled oscillator of claim 4 in which said first storage device terminal is coupled only through the series circuit of said first and second inverter of said first inverter means to said input of said first NOR device, and said second capacitor terminal is coupled only through the series circuit of said first and second inverter of said second inverter means to said input of said second NOR device.

6. The voltage controlled oscillator of claim 5 in which each of said third and fourth inverter means comprises three stages of inversions.

7. A voltage controlled oscillator whose frequency is a function of an input voltage comprising
means for supplying current of value which is a function of said input voltage,
a capacitor having a first and a second terminal,
a first and second pair of switching transistors adapted to be switched at state transitions and coupled respectively to said first and second terminals of said capacitor, each pair having a first and a second transistor, one terminal of each of said first transistors being connected to said current supplying means and one terminal of each second transistors being connected to a reference potential,
first and second cross-connected NOR devices,
first and second inverter means each for providing an even number of inversions and respectively coupled between said first and second capacitor terminal and an input of said first and second NOR devices,
third and fourth inverter means for providing an odd number of inversions and coupled respectively between an output of said first and second NOR devices and an input of said first and second pair of transistors for controlling said transistors to (1) turn on one of said first transistors and couple its respective capacitor terminal to said current supplying means and (2) turn off the other first transistor and couple its respective capacitor terminal to said reference potential and upon state transition to first turn off said one first transistor and couple its respective capacitor terminal to said reference potential before turning on said other first transistor and coupling its respective capacitor terminal to said current supplying means.

8. The voltage controlled oscillator of claim 7 in which a first leg comprising said first inverter means, said first NOR device and said third inverter means has the same number of propagation delays as a second leg comprising said second inverter means, said second NOR device and said fourth inverter means whereby upon said state transition, there is one propagation delay through one of said NOR devices between said turn off of said one first transistor and the subsequent turn on of said other first transistor.

9. The voltage controlled oscillator of claim 8 in which an additional input of said first NOR device is directly connected to said output of said second NOR device and an additional input of said second NOR device is directly connected to said output of said first NOR device.

10. The voltage controlled oscillator of claim 9 in which each of said first and second inverter means comprises a first and a second inverter coupled in series circuit.

11. The voltage controlled oscillator of claim 10 in which said first capacitor terminal is coupled only through the series circuit of said first and second inverter of said first inverter means to said input of said first NOR device, and said second capacitor terminal is coupled only through the series circuit of said first and second inverter of said second inverter means to said input of said second NOR device.

12. The voltage controlled oscillator of claim 11 in which each of said third and fourth inverter means comprises three stages of inversions.

13. The voltage controlled oscillator of claim 11 in which said first transistors are CMOS P-channel transistors and said second transistors are CMOS N-channel transistors, the drains of said first and second transistor pairs are respectively connected to said first and second capacitor terminals.

* * * * *